United States Patent [19]

Sahara et al.

[11] 3,997,797
[45] Dec. 14, 1976

[54] FREQUENCY DISCRIMINATING CIRCUIT

[75] Inventors: Hiroshi Sahara, Tokyo; Yutaka Tanaka, Yokohama; Toshinobu Isobe, Tokyo, all of Japan

[73] Assignee: Sony Corporation, Tokyo, Japan

[22] Filed: Dec. 31, 1975

[21] Appl. No.: 645,873

[30] Foreign Application Priority Data

Jan. 16, 1975 Japan .................. 49-7374

[52] U.S. Cl. .................. 307/233 R; 329/140
[51] Int. Cl.² .................. H03D 3/26
[58] Field of Search ......... 307/233; 329/110, 140, 329/141, 142, 143

[56] References Cited
UNITED STATES PATENTS

| | | | |
|---|---|---|---|
| 2,773,181 | 12/1956 | Singel | 329/141 X |
| 3,183,449 | 5/1965 | Bray | 329/142 |
| 3,434,075 | 3/1969 | Hawkins | 307/233 X |
| 3,569,846 | 3/1971 | Matsuura | 329/140 |
| 3,621,409 | 11/1971 | Segawa | 307/233 X |

*Primary Examiner*—John S. Heyman
*Attorney, Agent, or Firm*—Lewis H. Eslinger; Alvin Sinderbrand

[57] ABSTRACT

A frequency discriminating circuit having a double tuned circuit with a transformer, which has a first and second resonant circuits. The first resonant circuit is composed of a capacitor, a primary winding of the transformer and a first variable inductance element and the second resonant circuit is composed of a capacitor, a secondary winding of the transformer and second and third variable inductance elements, wherein the quality factor Q of the second resonant circuit is much larger than that Q of the first resonant circuit. The center frequency of the frequency-response characteristic (so-called S characteristic) of the discriminating circuit can be adjusted by adjusting the second and third variable inductance elements and the linearity of the frequency response characteristic of the discriminating circuit can be adjusted by adjusting the first variable inductance element.

2 Claims, 7 Drawing Figures

FREQUENCY DISCRIMINATING CIRCUIT

BACKGROUND OF THE INVENTION

1. Field of the Invention

This invention relates generally to a frequency discriminating circuit and more particularly to a frequency discriminating circuit suitable for use with a color demodulator of a color television receiver for receiving a SECAM color television signal.

2. Description of the Prior Art

On manufacturing a frequency discriminating circuit, the center frequency and the linearity of the frequency response characteristic thereof are pre-adjusted to be a predetermined characteristic by suitably selecting values of inductance elements and capacitors used for a double tuned circuit in the frequency discriminating circuit. However, all inductance elements and capacitors do not always have the suitable values in initial, or owing to the circumferential temperature all frequency discriminating circuits are not always of the predetermined characteristic. So, each frequency discriminating circuit must be re-adjusted so as to be of the predetermined characteristic after manufacturing. Both the center frequency and the linearity of the frequency response characteristic of the frequency discriminating circuit (socalled S characteristic) must be of the predetermined characteristic in order that the frequency discriminating circuit is in optimum condition. The center frequency and the linearity are each depending on the resonant frequency and the band pass characteristic of the double tuned circuit in the frequency discriminating circuit. In a conventional frequency discriminating circuit, the inductance values and the coupling factor of primary and secondary windings of a transformer used in a double tuned circuit are adjusted by adjusting the insertion degree of a ferrite core into a bobbin around which the primary and secondary windings of the transformer are wound. By this adjustment, both the resonant frequency and band pass characteristic of the double tuned circuit, that is, the center frequency and the linearity of the S characteristic of the frequency discriminating circuit can be adjusted, but it is impossible to adjust the both independently. That is to say, by this adjustment, one of the center frequency and the linearity can be adjusted in order to be in the optimum condition, but the other of them is not in the optimum condition. In the case that this frequency discriminating circuit is used for a color demodulator of a color television receiver for receiving a SECAM color television signal, as the optimum frequency response characteristic (S-characteristic) can not be obtained, a satisfied image can not be reproduced.

SUMMARY OF THE INVENTION

According to an aspect of the present invention, there is provided a frequency discriminating circuit comprising a double tuned circuit which is supplied at its primary resonant circuit with a frequency modulated signal and in which the frequency modulated signal is added to two output signals of opposite polarities obtained from its secondary resonant circuit thereat, an amplitude detecting circuit supplied with the added signals, a first inductor or inductance element provided in the secondary resonant, and second and third inductors or inductance elements provided symmetrically in the second resonant circuit, in which the quality factor Q of the second resonant circuit is selected sufficiently greater than Q of the primary resonant circuit and the band pass characteristic of the double tuned circuit is adjusted by adjusting the inductance values of the first, second and third inductors.

It is an object of this invention to provide an improved frequency discriminating circuit which can be adjusted in its frequency response characteristic easily.

It is another object of this invention to provide a frequency discriminator particularly suitable for use with an FM demodulator of a SECAM color television receiver.

It is a further object of this invention to provide a frequency discriminator whose frequency response characteristic is always set at its optimum condition.

The above and other objects, features and advantages of this invention will be apparent from the following description taken in conjunction with the accompanying drawings.

DESCRIPTION OF THE PREFERRED EMBODIMENT

Figure 1:
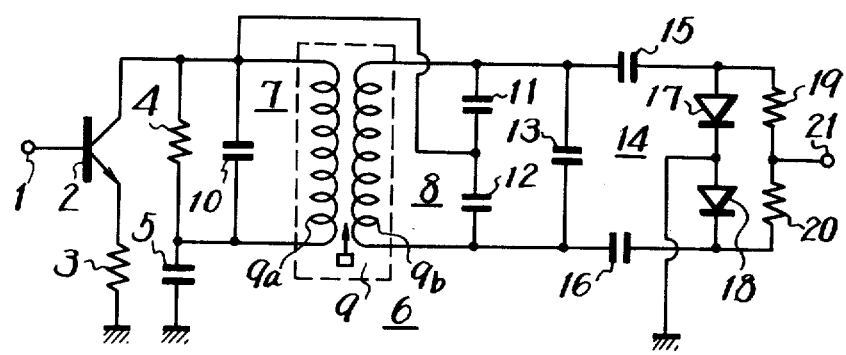
FIG. 1 is a schematic circuit diagram of a typical prior art frequency discriminating circuit.

Before describing the present invention, a prior art frequency discriminating circuit, which is used as an FM demodulator of a color television receiver for receiving a SECAM color television signal, will be described with reference to FIG. 1. In this figure reference numeral 1 designates an input terminal to which a frequency modulated signal is supplied and which is led out from the base electrode of a transistor 2. The emitter electrode of the transistor 2 is grounded through a resistor 3 and its collector electrode is also grounded through a resistor 4 and a capacitor 5. A double tuned circuit 6 is connected across the resistor 4 which consists of a primary resonant circuit 7 and a secondary resonant circuit 8. The double tuned circuit 6 includes a transformer 9 having a primary winding 9a and a secondary winding 9b which are wound on a common bobbin (not shown). In this case, the coupling degree of the primary and secondary windings 9a and 9b of the transformer 9 can be varied by inserting a dust (ferrite)-core (not shown) into the bobbin or moving out the dust-core from the bobbin.

The primary resonant circuit 7 is formed of the primary winding 9a of the transformer 9 and a capacitor 10 connected in parallel thereto, while the secondary resonant circuit 8 is formed of the secondary winding 9b and a capacitor 13 connected in parallel thereto. A series connection of capacitors 11 and 12 is connected in parallel to the capacitor 13. The collector electrode of the transistor 2 is connected to the connection point between the resistor 4 and the capacitor 10 and also to the connection point between the capacitors 11 and 12. Thus, in the secondary resonant circuit 8 of the double tuned circuit 6, the frequency-modulated signal is added to two outputs which are opposite in polarity and obtained across the capacitors 11 and 12 of the secondary resonant circuit 8. In this case, the capacitors 11 and 12 are selected equal in capacity.

To the secondary resonant circuit 8, connected in an amplitude detecting circuit 14 which consists of a capacitor 15 connected at its one electrode to one end of the secondary winding 9b of the transformer 9, a capacitor 16 connected at its one electrode to the other end of the secondary winding 9b, a diode 17 connected at its anode electrode to the other electrode of the capacitor 15, a diode 18 connected at its cathode electrode to the other electrode of the capacitor 16 and at its anode electrode to the cathode electrode of the diode 17, and a series connection of resistors 19 and 20 connected in parallel to the series connected diodes 17 and 18. In this case, an output terminal 21 to which an demodulated output signal is delivered, is led out from the connection point between the resistors 19 and 20, and the connection point between the cathode electrode of the diode 17 and the anode electrode of the diode 18 is grounded. Further, the capacitors 15 and 16 are selected equal in capacity, the diodes 17 and 18 are selected same in characteristics, and the resistors 19 and 20 selected equal in resistance value, respectively.

Figure 2:
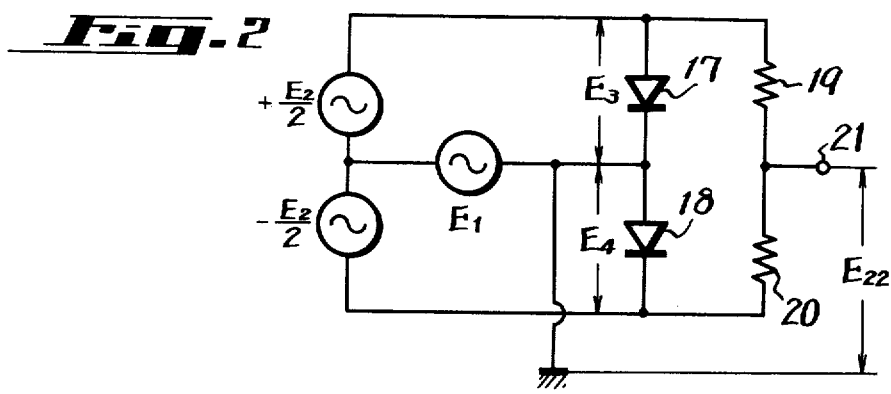
FIG. 2 is an equivalent circuit of that shown in FIG. 1.
Figure 3A:
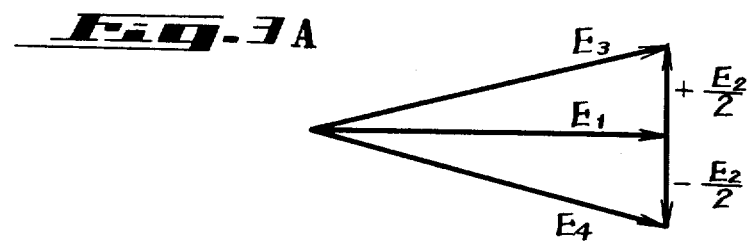
FIGS. 3A and 3B are vector diagrams of signals indicated in FIG. 2.

A description will be now given on the operation of the prior art frequency discriminating circuit shown in FIG. 1. FIG. 2 shows the equivalent circuit of the frequency discriminating circuit of FIG. 1. In FIG. 2 reference letter $E_1$ corresponds to the collector electrode of the transistor 2 or frequency modulated signal appeared at the primary resonant circuit 7 of the double tuned circuit 6, and $+ E_2/2$ and $- E_2/2$ output signals obtained across the capacitors 11 and 12 of the secondary resonant circuit 8 which are opposite in polarity. Further, reference letters $E_3$ and $E_4$ correspond to signals which are applied across the diodes 17 and 18, and $E_{22}$ a demodulated or detected output signal obtained between the output terminal 21 and the ground, respectively. In the double tuned circuit 6, the primary and secondary resonant circuits 7 and 8 are selected same in resonant frequency. Therefore, when the signal applied between the input terminal 1 and the ground is not modulated or a signal with the frequency of $f_o$, there is the phase difference of 90° between the frequency modulated signal $E_1$ supplied to the primary resonant circuit 7 of the double tuned circuit 6 and the output signals $+ E_2/2$ and $- E_2/2$ obtained across the capacitors 11 and 12 of the secondary resonant circuit 8 are equal in absolute value. Thus, as shown in FIG. 3A, the composite output $E_3$ obtained across the diode 17 is the vector sum of the signals $E_1$ and $+ E_2/2$, while the composite output $E_4$ obtained across the diode 18 is the vector sum of the signals $E_1$ and $- E_2/2$, and hence the absolute values of the signals $E_3$ and $E_4$ are equal. As a result, in such a case, no output signal is obtained between the output terminal 21 and the ground.

Figure 3B:
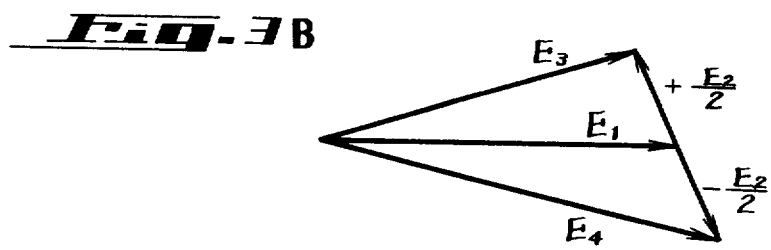

When the signal applied to the input terminal 1 is a frequency modulated signal, the phases of output signals obtained across the capacitors 11 and 12 in the secondary resonant circuit 8 of the double tuned circuit 6 are shifted relative to the phase of the frequency modulated signal applied to the primary resonant circuit 7 from 90° by a predetermined value in accordance with the modulation degree of the frequency modulated signal, as shown in FIG. 3B. As a result, a difference is produced between the absolute values of the output signals $E_3$ and $E_4$ obtained across the diodes 17 and 18, and accordingly between the output terminal 21 and the ground there is produced a signal in response to the modulation degree of the frequency modulated signal supplied across the input terminal 1 and the ground, that is, a demodulated signal.

Figure 4:
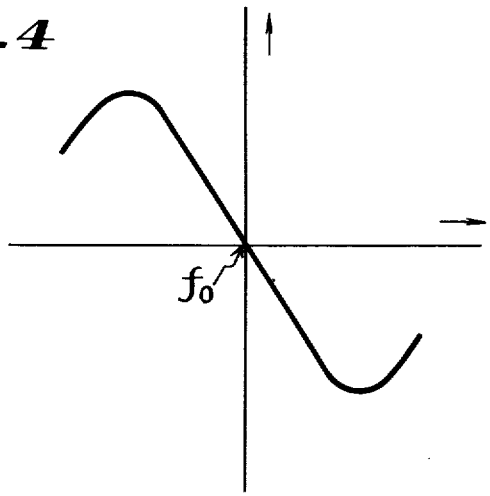
FIG. 4 is a graph showing the frequency-output characteristic of a frequency discriminating circuit shown in FIG. 1.

Thus obtained demodulated signal is a color difference signal in the case of the television receiver which receives a color television signal of the SECAM system. In such a television receiver, two of the above mentioned frequency discriminating circuits are used, and a carrier color signal and a carrier color signal, which is delayed by one line interval from the former, are alternately supplied to the respective FM demodulating circuits from which different color difference signals are derived therefrom. As a result, a demodulated output signal, which has a so-called S-characteristic relative to the variation of the frequency of the frequency modulated signal applied between the input terminal 1 and the ground with the center frequency $f_o$ thereof as the variation center as shown in the graph of FIG. 4, can be obtained between the output terminal 21 and the ground.

Figure 5:
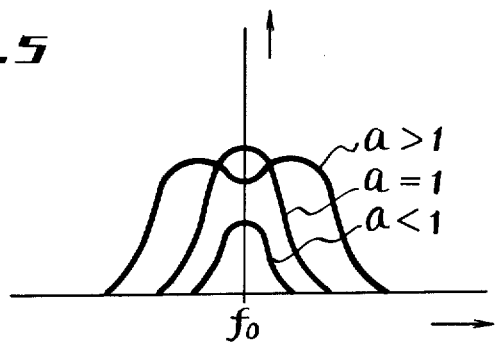
FIG. 5 is a graph showing the frequency-output characteristic of a double tuned circuit used in the frequency discriminating circuit shown in FIG. 1.

If the coupling constant of the transformer 9 of the double tuned circuit 6 is assumed as k, the quality factor Q of the primary resonant circuit 7 as $Q_1$ and that Q of the secondary resonant circuit 8 as $Q_2$, and a is defined as $$a = k \sqrt{Q_1 \cdot Q_2}$$

the output characteristics of the double tuned circuit 6 for the variation of the frequency become a single-peak characteristic as shown in the graph of FIG. 5 when $a = 1$ and $a < 1$, respectively, but become a double peak characteristic shown in FIG. 5 when $a > 1$. In this case, the values of $k$, $Q_1$ and $Q_2$ are selected so as to make the value of a as a suitable value greater than 1 ($a > 1$) and hence the double tuned circuit 6 has a predetermined band. The center or resonant frequency $f_o$ of the double tuned circuit 6 is, of course, determined by selecting the values of the respective capacitors and inductors thereof.

It is sufficient that the double tuned circuit 6 is previously set to have a predetermined frequency output characteristic, but due to a temperature characteristic, scatterings of circuit elements and so on, it is necessary to correct or adjust the characteristics after the circuit elements are assembled. As the adjustments, it is required to adjust the resonant or center frequency $f_o$ of the double tuned circuit 6 and the linearity of the frequency-demodulated output characteristic shown in FIG. 4. In this case, with the prior art frequency discriminating circuit shown in FIG. 1, it is very difficult to adjust its resonant frequency $f_o$ and the linearity of the frequency-demodulated output characteristic independently.

An embodiment of the frequency discriminating circuits according to this invention, in which its resonant frequency and the linearity of frequency-demodulated output characteristic can be variably adjusted independently, will be hereinafter described with reference to FIG. 6 in which the elements corresponding to those used in FIG. 1 are marked with the same reference numerals and their detailed description will be omitted for the sake of brevity.

Figure 6:
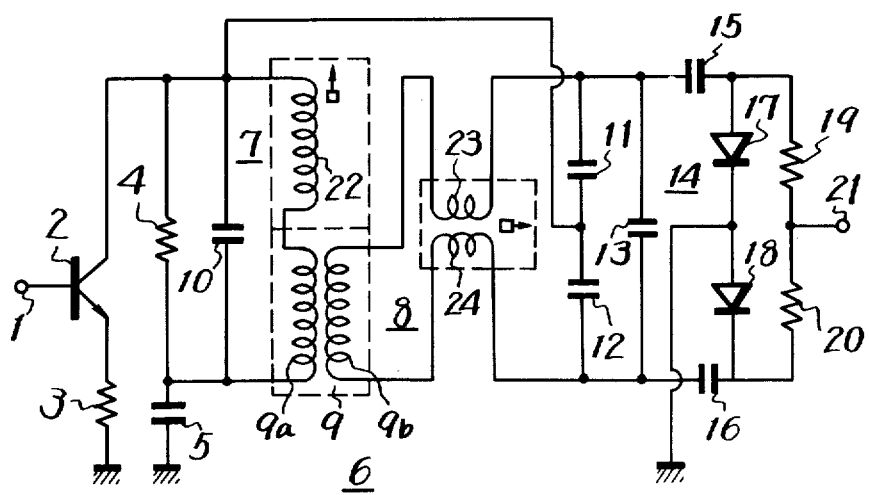
FIG. 6 is a schematic circuit diagram of an embodiment of the frequency discriminating circuits according to this invention.

The difference between the frequency discriminating circuit of the invention shown in FIG. 6 and that shown in FIG. 1 resides in the construction of the double tuned circuit 6, and the other circuit construction of the former is substantially same as that of the latter. That is, in the embodiment of the invention shown in FIG. 6, a choke coil 22 is provided in the primary resonant circuit 7 of the double tuned circuit 5 as a first inductor or inductance element. In other words, the coil 22 is connected in series to the primary winding 9a of the transformer 9. In this case, the coil 22 is not electro-magnetically coupled to or is electro-magnetically shielded from the transformer 9, and the transformer 9 is fixed at its coupling degree. In fact, the coil 22 is wound on a bobbin (not shown) and its inductance is varied by inserting a dust(ferrite)-core into the bobbin or moving out the dust-core from the bobbin to thereby vary the resonant frequency of the primary resonant circuit 7. Further, coils 23 and 24 are provided symmetrically in the secondary resonant circuit 8 of the double tuned circuit 6 as second and third inductors or inductance elements. In this case, the coils 23 and 24 are wound on a bobbin (not shown) in a bifilar winding manner so as not to cancel the signals, and the resonant frequency of the secondary resonant circuit 8 can be varied by inserting a dust(ferrite)-core (not shown) into the bobbin or moving out the dust-core from the bobbin. The coils 23 and 24 are connected in series between the both ends of the secondary winding 9b of the transformer 9 and the both terminals of the capacitor 13, respectively.

In the embodiment of the invention shown in FIG. 6, the quality factor $Q_1$ of the primary resonant circuit 7 and that $Q_2$ of the secondary resonant circuit 8 are selected as $Q_2>Q_1$, for example, $Q_2 \geqq 5Q_1$. In practice, it may be considered that this condition is obtained by reducing the resistance value of the resistor 4 in the primary side to lower the quality factor $Q_1$ or increasing the DC resistance component of the inductor in the primary side to lower the quality factor $Q_1$. Thus, the resonant frequency $f_0$ of the double tuned circuit 6 is mainly dominated with the resonant frequency of the secondary resonant circuit 8.

With the frequency discriminating circuit of the invention shown in FIG. 6, the linearity of the frequency-demodulated output characteristic thereof can be varied by changing the inductance of the coil 22 without substantially changing the resonant frequency of the double tuned circuit 6, and also the resonant frequency of the secondary resonant circuit 8 or that of the double tuned circuit 6 can be varied by changing the coupling degree of the coils 23 and 24 without exerting any influence upon the variation of the linearity of the frequency-demodulated output characteristic.

When the frequency discriminating circuit of the present invention described as above is employed as the FM demodulating circuit in a color television receiver which may receive a color television signal of the SECAM system, the FM demodulating circuit can be adjusted easily so as to improve the quality of a reproduced picture.

It will be apparent that many modifications and variation could be effected by those skilled in the art without departing from the spirits or scope of the novel concepts of the present invention, so that the scope of the invention should be determined by the appended claims only.

We claim as our invention:

1. A frequency discriminating circuit comprising:
   a. an input circuit;
   b. an amplitude detecting circuit; and
   c. a double tuned circuit connected between said input circuit and said amplitude detecting circuit, said double tuned circuit including,
      i. a transformer having a primary winding and a secondary winding,
      ii. a first variable inductance element connected in series to said primary winding and magnetically shielded from said transformer,
      iii. a first capacitor connected in parallel with a first series connection of said primary winding and said first variable inductance element to form a first resonant circuit together with said first series connection,
      iv. a second variable inductance element connected to one end of said secondary winding, said second variable inductance element being shielded magnetically from said transformer,
      v. a third variable inductance element connected to the other end of said secondary winding, said third variable inductance element being magnetically shielded from said transformer,
      vi. a second capacitor connected in parallel with a second series connection of said secondary winding, said second and third variable inductance elements forming a second resonant circuit together with said second series connection, said second resonant circuit having a quality factor larger than that of said first resonant circuit,
      vii. means for adding an input signal and two signals of opposite phases appearing at the both ends of said secondary winding, and
      viii. means for applying said two added signals to said amplitude detecting circuit.

2. A frequency discriminating circuit according to claim 1, wherein said second and third variable inductance elements are magnetically coupled.

* * * * *